United States Patent [19]

Nickum

[11] Patent Number: 5,927,094
[45] Date of Patent: Jul. 27, 1999

[54] APPARATUS FOR COOLING AN ELECTRONIC DEVICE

[75] Inventor: Larry A. Nickum, Sioux City, Iowa

[73] Assignee: Gateway 2000, Inc., North Sioux City, S. Dak.

[21] Appl. No.: 08/990,373

[22] Filed: Dec. 15, 1997

[51] Int. Cl.[6] .............................. F25D 23/12; F01B 31/02; F01P 29/00
[52] U.S. Cl. ................................ 62/259.2; 60/508; 60/515
[58] Field of Search ......................... 62/259.2; 165/80.2, 165/80.3, 80.4; 361/688–703; 60/508, 515, 483

[56] References Cited

U.S. PATENT DOCUMENTS

| | | | |
|---|---|---|---|
| 4,578,949 | 4/1986 | Takei et al. | 60/517 |
| 4,790,284 | 12/1988 | Ferrenberg et al. | 123/543 |
| 4,815,290 | 3/1989 | Dunstan | 60/517 |
| 4,848,090 | 7/1989 | Peters | 62/3.3 |
| 5,323,847 | 6/1994 | Koizumi et al. | 165/104.33 |
| 5,333,460 | 8/1994 | Lewis et al. | 62/6 |
| 5,349,823 | 9/1994 | Solomon | 62/6 |
| 5,484,012 | 1/1996 | Hiratsuka | 165/40 |
| 5,491,610 | 2/1996 | Mok et al. | 361/695 |

OTHER PUBLICATIONS

*http://www.mech.saitama–u.ac.jp/kirik/home.html*, Dymanics of Machinery Laboratory web site, Saitama, Japan, 18 pages, (Printed Jan. 28, 1997—publication date unknown).
"1996 World Solar Challenge Executive Summary", University of Minnesota web site, 2 pages, (Printed Jan. 22, 1997—publication date unknown).
"A Primer on Stirling Engines", *http://www.tiac.net/users/pcag/solar/primer.htm*, Product Information by Bomin Solar, pp. 1–2, (Printed Jan. 28, 1997—publication date unknown).

(List continued on next page.)

Primary Examiner—Henry A. Bennett
Assistant Examiner—Melvin Jones
Attorney, Agent, or Firm—Schwegman, Lundberg, Woessner & Kluth, P.A. & Anthony Claiborne

[57] ABSTRACT

A cooling apparatus is provided in an electronic device, where the cooling apparatus operates on waste heat provided by a heat producing component, such as a computer processor. The cooling apparatus has at least one chamber which is thermally coupled with the processor such that heat from the processor expands the gas within the chamber. The expansion causes movement to a movable piston disposed within the chamber which rotates a crankshaft and fans coupled therewith. The expanded gas is cooled in another portion of the chamber or in another chamber. The cooled gas decreases in volume causing a piston to move, further rotating the crankshaft. The cycle begins again as the momentum of the crankshaft assists in reciprocating the piston or pistons and as additional heat from the processor is drawn into the chamber. The rotational movement of the crankshaft can be used to drive fans thereby cooling the electronic device. In addition, the rotational movement of the crankshaft can be used to power electromechanical devices, which are then used to provide a trickle charge for batteries.

20 Claims, 6 Drawing Sheets

OTHER PUBLICATIONS

"Frequently Asked Questions", http://www.fn.net/~brentvan/faq.htm, Product information by American Stirling Company, pp. 1–3 (1996).

"Gallery", http://www.fn.net/~brentvan/gallery.htm, Gallery website by American Stirling Company, 3 pages (1996).

"How to Buy a Stirling Engine", http://www.stirlingcycle.com/thumb.html, Product Information from American Stirling Co., 2 pages, (printed Jan. 22, 1997 publication date unknown).

"Let's Build a Can Stirling Engine", http://www.bekkoame.or.jp/~khirata/english/mk can.html, 2 pages (printed Jan. 28, 1997—publication date unknown).

"Let's build a TSE–03", http://www.bekkoame.or.jp/~khirata/endlish/mk t03.html, 1 page (printed Jan. 28, 1997—publication date unknown).

"Stirling Engines", http://www.tamin.com/stirling.html, Product Information from Tamin Enterprises, 1 page, (Printed Jan. 22, 1997—publication date unknown).

"Stirling Prayer Engine", http://www.bobblick.com/bob/stirling/, 2 pages (1996).

"Structure of Stirling Engines", http://www.bekkoame.or.jp/~khirata/english/struct.htm, 1 page (printed Jan. 28, 1997—publication date unknown).

"The Coffee Cup Stirling Engine in a nutshell", http://www.fn.net/~brentvan/coff cup.htm, Product Information from American Stirling Company, 1 page (printed Jan. 28, 1997—publication date unknown).

"Typical Stirling Engine Experiments", http://www.pasco.com/html–bin/newprod/seexp.htm, Product information from Pasco, 1 page, (printed Jan. 22, 1997—publication date unknown).

Ball, D.A., et al., "Auxilliary Power Generation for Gas Heating Systems: Evaluation of the Business Potential", Report Number GRI–95–0343, Battelle Memorial Institute, Columbus, OH, 1 page (Feb. 1995).

Daniels, F., "Direct Use of the Sun's Energy", Published by Yale University, Cover, Title page, pp. 260–267, (1964).

Glenn, G., "Stirling Update#1", 1 page (Sep. 15, 1996).

APPARATUS FOR COOLING AN ELECTRONIC DEVICE

FIELD OF THE INVENTION

The present invention relates generally to electronic equipment. More particularly, it pertains to dissipating heat generated by electronic equipment, such as computers and portable computers.

BACKGROUND OF THE INVENTION

Electronic devices, including computers, and in particular lap top computers, have many inherent design challenges, including decreasing package size, increasing complexity, and limited power availability. Another design challenge is the elimination of excess heat that is generated by the electronics. As individual component size decreases and device complexity increases, the amount of excess heat generated in smaller areas increases. One component that generates more heat in a small area is the central processing unit (CPU). The effect of the heat generated is intensified by the close spacing of the components on printed circuit boards and the close spacing of printed circuit boards within electrical devices. Excessive heat can degrade system performance and reliability, and possibly cause system failure. As a result, heat dissipation methods and devices are critical in the electronics industry.

One technique used to dissipate heat near the electronic components is to incorporate an electrically powered motor to drive a fan for directing cooling air over a warm device. However, the use of a fan to move air through a unit requires additional power, creates additional heat, and creates additional noise and thus is not always a practical solution. There has been extensive work in developing effective methods of moving heat away from the heat generating components, such as the CPU, to a heat dissipating component, for example, a heat sink. One such method of moving heat is a heat pipe. These devices effectively move heat from one location to another within the electronic device. However, the heat, a valuable source of thermal energy, is merely dissipated away out into the atmosphere from the electrical components and discharged as waste heat.

Another approach for dissipating heat away from electronic components includes various finned heat sinks which dissipate heat from the surfaces of metal fins. The finned heat sinks are attached to the electronic component to be cooled and are often used in computer systems with electric fans that drive air over the fins to enhance their cooling effect. The problem with these devices is that the finned heat sinks and the electric fans take up valuable space within the computer. Moreover, if the electric fan fails, then excess heat buildup within the computer can cause system failure.

Accordingly, what is needed is a way to cool an electronic device without consuming additional system power nor creating additional system heat. What is further needed is a useful manner for dissipating excess heat from system components.

SUMMARY OF THE INVENTION

A system for cooling electrical components, having a cooling apparatus, is provided for use with an electronic device generating heat, such as a computer with a processor. In one embodiment, the cooling apparatus is thermally coupled with the heat producing component and has a flywheel, a means for converting the waste heat from the heat producing component into rotational movement of the flywheel, and a fan coupled with the flywheel. As the heat producing component generates heat, the flywheel and the fan are rotated. The rotating fan assists in moving air through the system and cools the system.

In another embodiment, the cooling apparatus comprises a hot chamber and a cold chamber, each containing a reciprocating piston therein, where the pistons are each coupled with a flywheel. The hot chamber is thermally coupled with a processor, and in one embodiment, also has a heat slug coupled with the chamber and the processor. Heat from the processor is conveyed to working gas within the hot chamber, which expands and moves the piston therein. The piston movement rotates the flywheel, which acquires momentum and moves the gas from the hot chamber to the cold chamber through a conduit. The cold chamber also has a heat sink coupled therewith for cooling the expanded gas moved therein. The cooled gas is reduced in volume and retracts the piston within the cold chamber, further rotating the flywheel, and a fan coupled with the flywheel.

In yet another embodiment, a generator is coupled with the flywheel, such that rotational movement of the flywheel powers the generator. The generator converts the mechanical energy to electrical energy suitable for charging a battery device of a computer. Alternatively, a gearbox is coupled between the flywheel and the generator, and a rectifying circuit is used to change the alternating current from the generator to direct current.

In another configuration, the cooling apparatus comprises a single chamber having a first portion and a second portion. The chamber is thermally coupled with the heat producing component proximate the first portion and has a displacer movable between the first and second portions. The second portion of the chamber is cooled with a heat sink which is thermally coupled therewith. In addition, the chamber also has a power piston movably disposed in the second portion of the chamber. The power piston is coupled with a rotatable crankshaft such that as the power piston reciprocates between a first and second position, the crankshaft is rotated. In yet another embodiment, at least one fan is coupled with the crankshaft and rotates with the crankshaft. Alternatively, the fan is weighted to provide additional momentum for the apparatus.

The system provides a significant benefit over prior art systems since heat is drawn away from the processor, thereby cooling the processor, where the processor is cooled using its own waste heat. The heat from the processor or other heat producing component drives the apparatus and eventually drives a fan blade, which further cools the processor and the entire computer system. Advantageously, the apparatus cools the processor and the entire computer system without requiring fuel or additional energy since it is powered by the heat generated by the processor. The apparatus converts waste heat into mechanical energy which can be used to cool the system. In addition, the apparatus converts the mechanical every into useful electricity. The use of this waste heat to generate a trickle charge for the system battery allows for a longer battery life for portable computers.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the spirit and scope of the present invention. Therefore, the following detailed description is not to be taken in a limiting sense, and the scope of the present invention is defined by the appended claims.

Figure 1A:
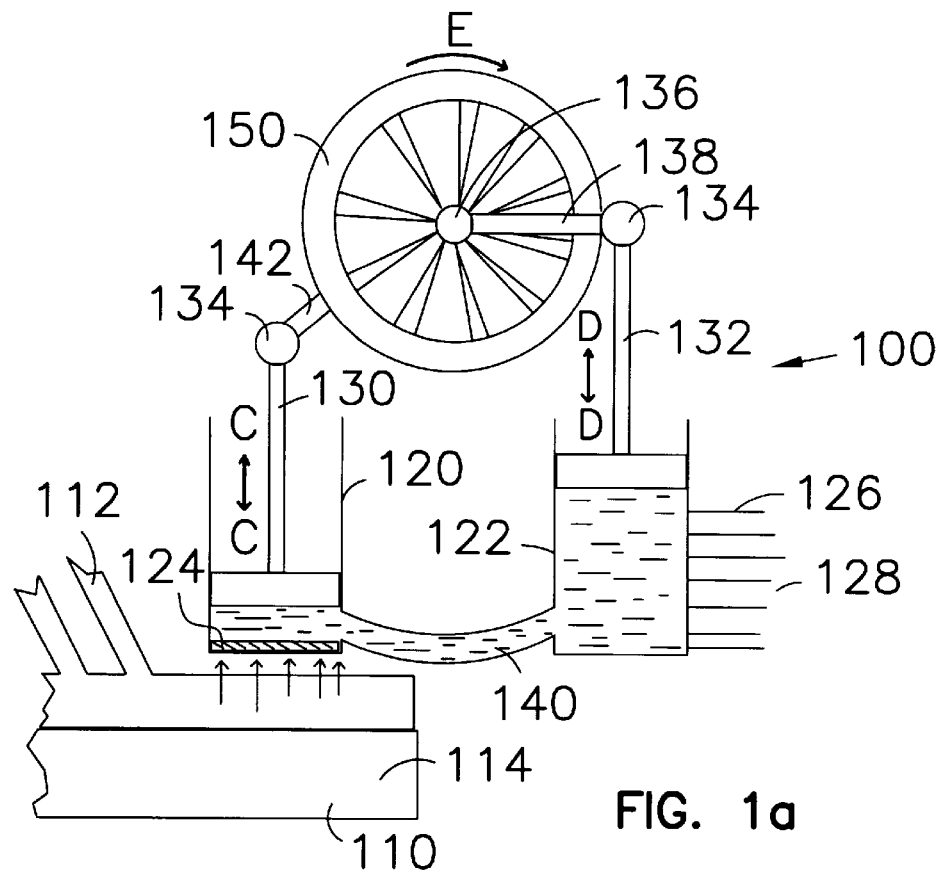
FIG. 1a is a block diagram illustrating a cooling apparatus constructed in accordance with one embodiment of the present invention.
Figure 1B:
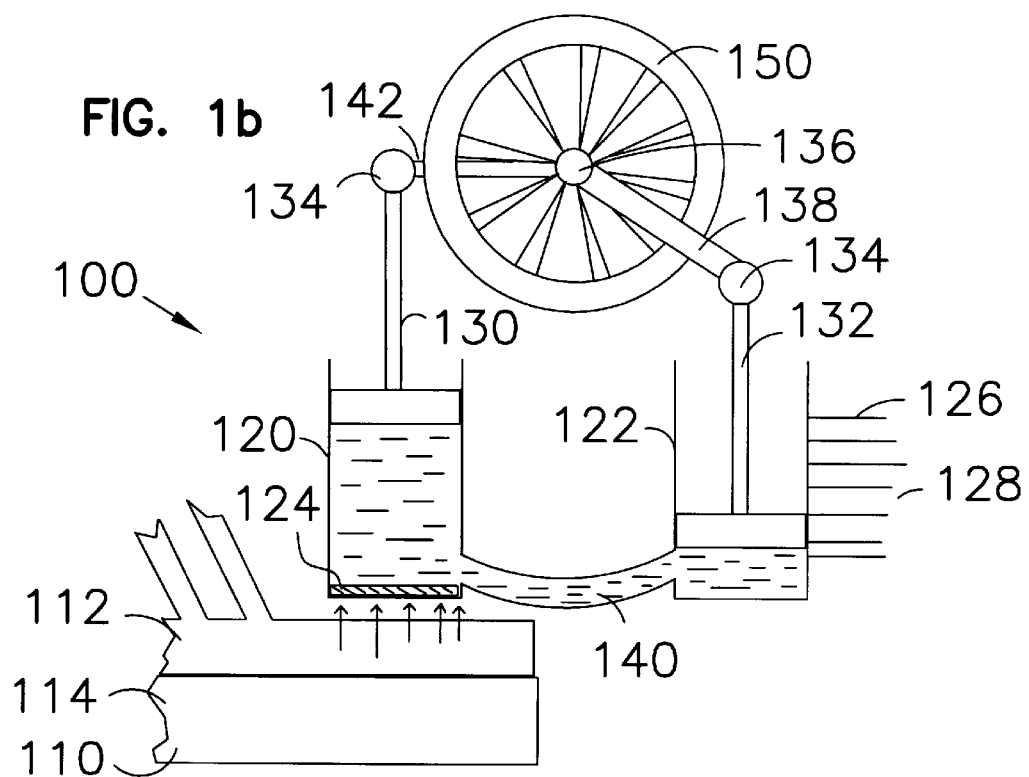
FIG. 1b is a block diagram illustrating a cooling apparatus constructed in accordance with one embodiment of the present invention.

FIGS. 1a and 1b illustrate a first embodiment of a cooling apparatus 100. The cooling apparatus 100 is for use with electronic components with heat producing components, which generate waste heat typically dissipated into the environment. The cooling apparatus 100 generally comprises a hot chamber 120, a cold chamber 122 and a flywheel 150. In one embodiment, the flywheel 150 has a fan blade attached therewith. The hot chamber 120 has a hot piston 130 disposed therein, where the hot piston 130 is coupled with a first connecting rod 142 at coupling 134. In one embodiment, the hot chamber 120 is insulated. The first connecting rod 142 is coupled with the flywheel 150 at coupling 136. Similarly, cold chamber 122 has a cold piston 132 received therein. The cold piston 132 is coupled with a second connecting rod 138 at a coupling 134. The second connecting rod 138 is coupled with the flywheel 150 at coupling 136. The couplings 134, 136 operate as bearings between the various components between which they are coupled. The couplings 134, 136 can also be lubricated to facilitate movement between the various components.

Each chamber 120 and 122 contains a variable amount of working gas or air within. The gas contained therein can be air or other gases, and are considered within the scope of the invention. The volume of working gas contained within the individual chambers 120, 122 depends on the displacement of the pistons 130, 132. The working gas in the apparatus 100 is sealed, such that the gas does not go in and out of the chambers 120, 122 to the atmosphere. The pistons 130 and 132 are each coupled with the flywheel 150 such that as the volume in one chamber is reduced, the volume in the other chamber is increased, as will be further discussed below.

The cooling apparatus 100 is provided adjacent to a heat-producing component 114 such that heat from the heat producing component 114 is transferred to the cooling apparatus 100. In one embodiment, the heat-producing component 114 comprises a processor 110 as used in a computer or a portable computer. Alternatively, other heat producing components in other electronic devices can also be used as a heat source, and are considered within the scope of the invention. Thermally coupled with the processor 110 is a processor heat sink 112. The processor heat sink 112 is thermally coupled with the processor 110 and, in one embodiment, is also thermally coupled with a heat slug 124. The processor heat sink 112 assists in cooling the processor 110 as the heat sink 112 draws heat away from the processor 110 and into the environment. The heat sink 112 also supplies heat to the heat slug 124 for operation of the cooling apparatus 100. The hot chamber 120 is thermally coupled with the heat slug 124, such that the heat slug 124 transfers the heat from the processor 110 to the hot chamber 120 during use. The purpose of the heat slug 124 is to draw heat into the hot chamber 120 to operate the cooling apparatus 100.

Disposed between and coupled with the hot chamber 120 and the cold chamber 122 is a conduit 140. The conduit 140 provides a passage for the volume of working gas within either chamber to pass through to the other chamber as the pistons 130, 132 are reciprocating. In addition, the conduit 140 provides a thermal path between the hot chamber 120 and the cold chamber 122. In one embodiment, the conduit 140 is coated with material having high heat conductivity, such that the conduit 140 acts as a regenerator where heat can be stored and re-used when the working gas travels toward the hot chamber 120. The exhaust gases are pre heated by the conduit 140 before it re-enters the hot chamber 120 from the cold chamber 122.

A cold chamber heat sink 126 is thermally coupled with the cold chamber 122. In one embodiment, the cold chamber heat sink 126 has a plurality of fins 128 for increasing the surface area of the heat sink 126. The purpose of the cold chamber heat sink 126 is to draw heat away from and out of working gas within the cold chamber 122. Alternatively, a cooling device other than a heat sink can be used to cool the cold chamber 122.

During operation of the cooling apparatus 100, the hot piston 130 travels in an up and down motion marked as C—C in FIG. 1. The terms up, down, upward, and downward are arbitrary and are used herein only to describe the operation of the components and are not intended to limit the orientation of the cooling apparatus 100 in any manner. As the hot piston 130 travels in this type of direction, the first connecting rod 142 is rotated by the hot piston 130 and provides torque to the flywheel 150. As the flywheel 150 is rotated in the direction marked E on FIG. 1, the flywheel 150 acquires momentum from the hot piston 130, as will be discussed further below. Similarly, the cold piston 132 travels in an up and down motion marked as D—D. The up and down motion of the cold piston 132 rotates the second connecting rod 138. The second connecting rod 138 also provides torque to the flywheel 150.

As the processor 110 generates heat, the processor heat sink 112 draws heat away from the processor 110 and disperses the heat into the environment, and also conveys the heat to the heat slug 124. The heat slug 124 draws heat away from the processor heat sink 112 and into the hot chamber 120 of the cooling apparatus 100. As the heat is drawn into the hot chamber 120, the gas inside the hot chamber 120 is heated and expands. The expansion of the working gas forces the hot piston 130 upward, as shown in FIG. 1b and rotates the flywheel 150. After the heated working gas has expanded in the hot chamber 120 and the hot piston 130 is at the end of its expansion stroke, the momentum of the flywheel 150 reverses the direction of the hot and cold pistons 130, 132. The momentum of the flywheel 150 rotates the first connecting rod 142 which then forces the hot piston 130 down, reducing the volume within the hot chamber 120. As the volume is reduced, the working gas is forced through the conduit 140 and into the cold chamber 122. As the working gas is forced into the cold chamber 122, the cold piston 132 is forced upward to expand the volume within the cold chamber 122.

The cold chamber heat sink 126 then draws the heat away from the working gas within the cold chamber 122, and the working gas within the cold chamber 122 is cooled. As the heat is drawn out of the working gas, the volume of the working gas reduces and the cold piston 132 is retracted down towards the bottom of the cold chamber 122. In addition, the momentum of the flywheel 150 continues to reciprocate the pistons 130, 132 and thereby forces the working gas back through the conduit 140 to the hot chamber 120. Simultaneously, as the cooled working gas is moved from the cold chamber 122, heat is drawn into the hot chamber 120 by the heat slug 124. Again, the heated working gas expands within the hot chamber 120 forcing the hot piston 130 in an upward direction, and adding momentum to the flywheel 150. The cycle begins again and continues over and over until heat is no longer provided to the working gas. The cooling apparatus 100 has simultaneously cooled the processor 110 and converted the waste heat to kinetic energy. The momentum of the rotating flywheel 150 can be used to power other components within the system.

Figure 2:
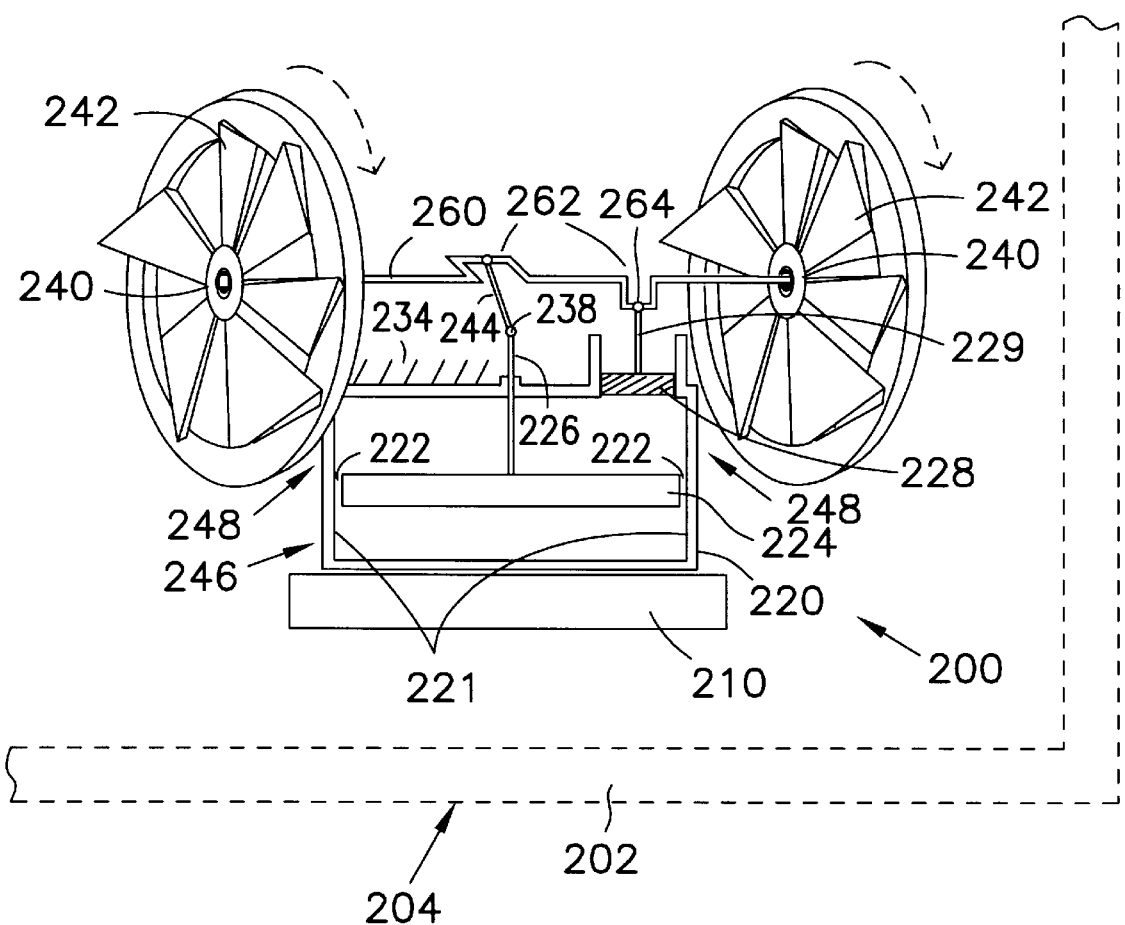
FIG. 2 is a first side elevational view illustrating a cooling apparatus constructed in accordance with another embodiment of the present invention.

FIG. 2 illustrates another embodiment of the present invention. A cooling apparatus 200 is shown with a single chamber 220, a crankshaft 260, a power piston 228, and fans 240. In one embodiment, the cooling apparatus 200 is disposed within a housing 202 of a computer 204. The chamber 220 has a displacer 224 disposed therein which is coupled with the crankshaft 260, as will be discussed further below. In one embodiment, the chamber 220 is insulated. The cooling apparatus 200 is disposed adjacent to a heat-producing component, such as a processor 210 in a computer. The cooling apparatus 200 cools the heat producing component, and also assists in cooling the environment proximate to the heat producing component. One of the many advantages of the cooling apparatus 200 is the apparatus 200 uses the waste heat from the heat producing component to cool the environment, and no additional energy is necessary.

The displacer 224 is movably disposed within the chamber 220, such that a gap 222 exists between the displacer 224 and inner walls 221 of the chamber 220. The displacer 224 has a piston rod 226 coupled at coupling 238 with a connecting rod 244. The couplings act as a bearing and allow for the components to rotate relative to one another. The connecting rod 244 is then coupled with the crankshaft 260. The power piston 228 is also movably disposed within the chamber 220 as shown in FIG. 2, and has a piston rod 229 which is also coupled with the crankshaft 260. The volume of the chamber 220 varies depending on the position of the power piston 228, as will be further discussed below.

The crankshaft 260 has a first throw 262 and a second throw 264 which couple with the connecting rod 244 of the displacer 224 and the piston rod 229 of the power piston 228, respectively. The first throw 262 and second throw 264 are spaced apart, in one embodiment, in a ninety degree phase angle for facilitating the cycle of the displacer 224 movement and the power piston 228 movement. The first and second throws 262, 264 facilitate translating the reciprocal motion of the displacer 224 and the power piston 228 to rotational movement of the crankshaft 260.

The crankshaft 260 also has at least one fan 240 coupled therewith. In one embodiment, a fan 240 is disposed on each end of the crankshaft 260. Alternatively, a plurality of fans can be provided on the crankshaft 260. In another configuration, the rotational movement of the crankshaft 260 could drive another cooling mechanism, and is still considered within the scope of the invention. Each fan 240 is coupled with the crankshaft 260 such that rotation of the crankshaft 260 causes rotation of each fan 240. The fan 240, in one embodiment, is comprised of a plurality of blades 242. The blades 242 extend away from the crankshaft 260 a distance long enough to force air over the upper portion 248 of the chamber 220. In another embodiment, the blades 242 of the fan 240 are weighted such that as the fan 240 is rotated, the weight of the blades 242 allows the fan 240 to acquire momentum.

The chamber 220 is defined in part by a lower portion 246 and an upper portion 248, where the displacer 224 is generally moved between the upper portion 248 and the lower portion 246. The chamber 220 also has a heat sink 234 mounted on a top surface proximate the upper portion 248. The heat sink 234 facilitates in the removal of heat from the working gas in the upper portion 248 of the chamber 220. The removal of heat from the heat sink 234 is increased as the blades 242 of the fan 240 rotate and force air over the heat sink 234. The chamber 220 also has working gas disposed therein. The volume of working gas contained within the chamber 220 is defined by the chamber walls 221, and the power piston 228. Since the working gas expands and retracts during operation of the cooling apparatus 200 as will be explained below, the volume of air contained within the chamber 220 varies depending on the movement of the power piston 228.

During use, working gas in the lower portion 246 acquires heat from the heat-producing component 210. The heated working gas in the lower portion 246 then expands, causing the displacer 224 to be pushed in an upward direction toward the upper portion 248. As the displacer 224 moves in an upward direction, the piston rod 226 also moves in an upward direction. As the working gas continues to expand, pressure within the chamber 220 increases. As the pressure increases, the power piston 228 moves upward to expand the volume within the chamber. The upward movement of the power piston 228 causes the connecting rod 229 to move upward and apply a torque to the crankshaft 260. The torque on the crankshaft 260 causes the crankshaft to rotate. As the crankshaft 260 rotates, the fans 240 also rotate.

As the fans 240 begin to rotate, they acquire momentum. The momentum of the fans 240 causes the crankshaft 260 to continue to rotate. The continual rotation of the crankshaft 260 causes the connecting rod 244 to place a downward force on the piston rod 226. The downward force on the piston rod 226 then causes the displacer 224 to move toward the lower portion 246. The remaining heated working gas then flows to the upper portion 248 where it is cooled by the heat sink 234. As the air is cooled by the heat sink 234, this contracts the volume of the working gas within the chamber 220 and the power piston 228 moves downward. The downward movement of the power piston 228 further rotates the crankshaft 260 which in turn moves the displacer 224 again toward the upper portion 248 of the chamber 220. The working gas is displaced and moves down to the lower portion 246. The working gas in the lower portion 246 acquires heat from the processor 210 and expands, causing the displacer 224 to move in an upward direction. After the expansion, the heat further results in increased pressure, which raises the power piston 228. The cycle continues over and over again and the crankshaft 260 is continually rotated, which also rotates the fans 240. The rotation of the fans draws heat through the device in which this cooling apparatus 200 is inserted. In addition, the fans 240 draw air over the heat sink 234, thereby assisting in the cooling process of the air placed in the upper portion 248 which needs to be cooled.

Figure 3:
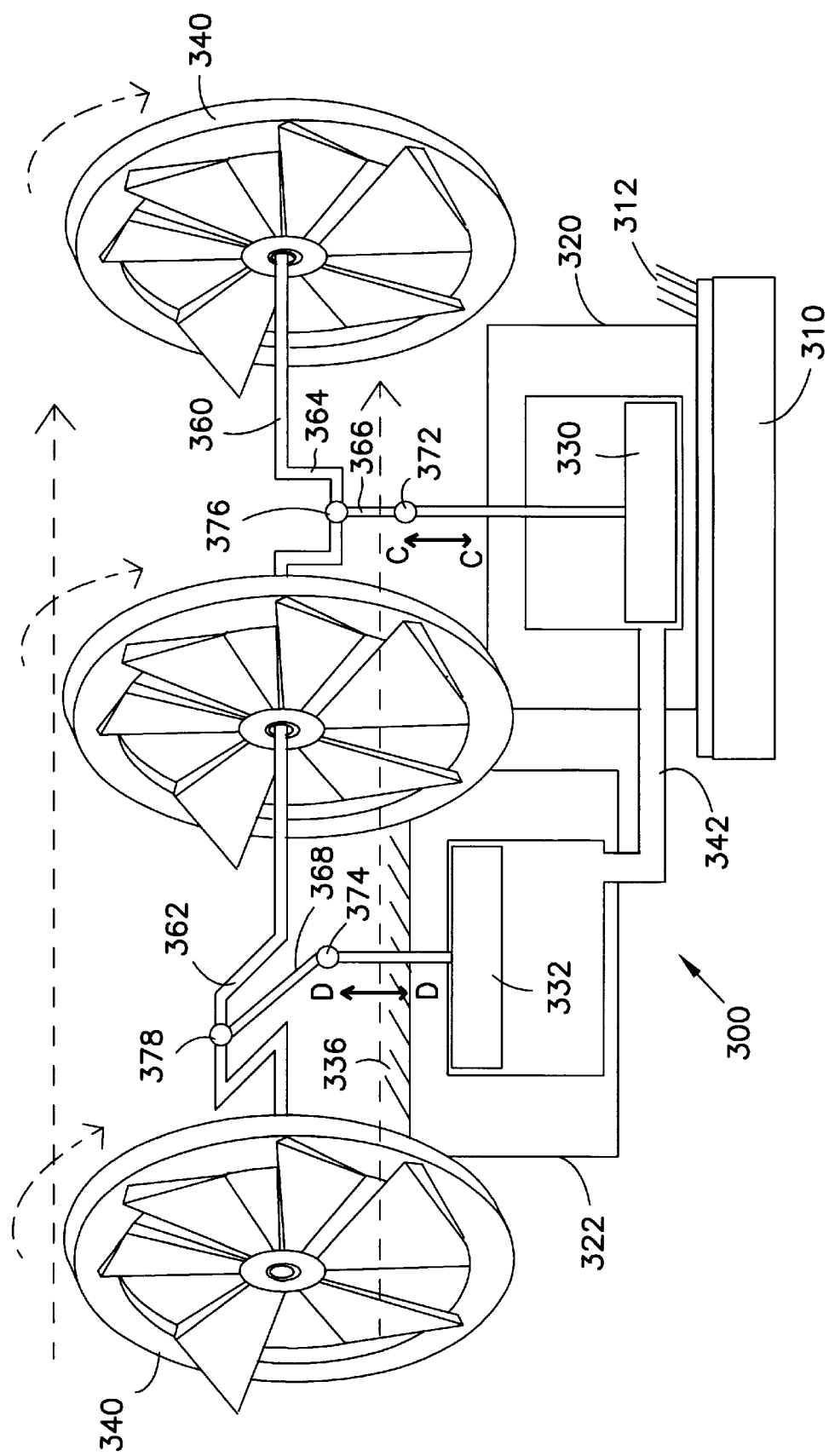
FIG. 3 is a first side elevational view illustrating a cooling apparatus constructed in accordance with yet another embodiment of the present invention.

FIG. 3 illustrates yet another embodiment of the present invention. A cooling apparatus 300 is shown and generally comprises a hot chamber 320, a cold chamber 322 and a crankshaft 360. Disposed within the hot chamber 320 is a hot piston 330. The cold chamber 322 has a cold piston 332 disposed therein. The hot chamber 320 is thermally coupled with a processor 310. The processor 310 conveys heat to the hot chamber 320, causing the expansion of air therein.

The hot piston 330 is coupled to a hot connecting rod 366 at coupling 372. The hot connecting rod 366 is coupled with the crankshaft 360 at coupling 376. Similarly, the cold piston 332 is coupled with a cold connecting rod 368 at a coupling 374. The cold connecting rod 368 is coupled with the crankshaft 360 at coupling 378. The couplings 372, 376, 374 and 378, each allow movement between the components that they couple. Specifically, the hot connecting rod 366 is coupled with a first throw 364 of the crankshaft 360. The cold connecting rod 368 couples with the second throw 362 of the crankshaft at coupling 378. These couplings, in combination with the first and second throws 364, 362, in combination with the hot connecting rod 366 and the cold connecting rod 368, allow the reciprocal motion of the piston to be translated into rotary motion and resulting torque to the crankshaft 360.

Each chamber 320 and 322 contains a variable amount of working gas within. The working gas comprises, in one embodiment, air, although other gases could also be used. The volume of working gas contained within the individual chambers 320, 322 depends on the displacement of the pistons 330, 332 which varies during the cycle of the cooling apparatus 300. The working gas in the apparatus 300 is sealed, such that the gas does not go in and out of the chambers 320, 322 to the atmosphere. The pistons 330, 332 are each coupled with the crankshaft 360 such that as the volume in one chamber is reduced, the volume in the other chamber is increased, as will be further discussed below.

The cooling apparatus 300 is provided adjacent to a heat-producing component disposed within an electronic device, such as a central processing unit 310 in a computer, such that heat from the processor 310 is transferred to the cooling apparatus 300. Although a processor 310 and a computer are described, other heat producing components and electronic devices could also be used and are considered within the scope of the invention.

A processor heat sink 312 is thermally coupled with both the processor 310 and the hot chamber 320. The processor heat sink 312 assists in cooling the processor 310 since the heat sink 312 draws heat away from the processor 310 and into the environment. In addition, the heat sink 312 conveys heat to the hot chamber 320 for operation of the cooling apparatus 300.

Disposed between the hot chamber 320 and the cold chamber 322 is a conduit 342. The conduit 342 is coupled with the hot chamber 320 and the cold chamber 322, and provides a passageway between the chambers 320, 322. The working gas travels through the conduit 342 from the hot chamber 320 to the cold chamber 322, and vice versa depending on the stage of the cycle. In addition to providing a passageway, the conduit 342 provides a thermal path between the hot chamber 320 and the cold chamber 322.

A cold chamber heat sink 336 is thermally coupled with the cold chamber 322. In one embodiment, the cold chamber heat sink 336 has a plurality of fins for increasing the surface area of the heat sink 336. The purpose of the cold chamber heat sink 336 is to draw heat away from and out of working gas within the cold chamber 336. Alternatively, in another configuration, a cooling device other than a heat sink can be used to cool the cold chamber 336.

During operation of the cooling apparatus 300, the hot piston 330 travels in an up and down motion marked as C—C in FIG. 3. As the hot piston 330 travels in this direction, the first connecting rod 366 is rotated by the hot piston 330 and provides torque to the crankshaft 360. As the crankshaft 360 is rotated, the crankshaft 360 and the fans 340 acquire momentum from torque applied by the hot piston 330, as will be further discussed below. Similarly, the cold piston 332 travels in an up and down motion marked as D—D on FIG. 3. The up and down motion of the cold piston 332 rotates the second connecting rod 368. The second connecting rod 368 also provides torque to the crankshaft 360 and the fans 340.

As the processor 310 generates heat, the processor heat sink 312 draws heat away from the processor 310 and disperses the heat into the environment, and also conveys the heat to the hot chamber 320. As the heat is drawn into the hot chamber 320, the air inside the hot chamber 320 is heated and expands inside of the chamber 320. The expansion of the working gas forces the hot piston 330 upward. As the hot piston 330 moves, the crankshaft 360 and the fans 340 are rotated. After the heated working gas has expanded in the hot chamber 320 and the hot piston 330 is at the end of its expansion stroke, the momentum of the crankshaft 360 and the fans 340 rotates the first connecting rod 366 which then forces the hot piston 330 downward, reducing the volume within the hot chamber 320. As the volume is reduced, the working gas is forced through the conduit 340 and into the cold chamber 322. As the working gas is forced into the cold chamber 322, the cold piston 332 is forced upward to expand the volume within the cold chamber 322.

The cold chamber heat sink 326 then draws the heat away from the working gas within the cold chamber 322, and the working gas within the cold chamber 332 is cooled. As the heat is drawn out of the working gas, the volume of the working gas reduces and the cold piston 332 is retracted down towards the bottom of the cold chamber 322. In addition, the momentum of crankshaft 360 and the fans 342 continues to reciprocate the pistons 330, 332 and thereby forces the working gas back through the conduit 340 to the hot chamber 320. Simultaneously, as the cooled working gas is moved from the cold chamber 322, heat is drawn into the hot chamber 320 from the processor heat sink 312. Again, the heated working gas expands within the hot chamber 320 forcing the hot piston 330 in an upward direction, and adding momentum to the crankshaft 360 and the fans 342. The cycle begins again and continues over and over until heat is no longer provided to the working gas. The cooling apparatus 300 has simultaneously cooled the processor 312 and converts the waste heat from the processor 312 to kinetic energy. A further advantage is that the momentum of the rotating crankshaft 360 and the fans 342 can be used to power other components within the system.

Figure 4A:
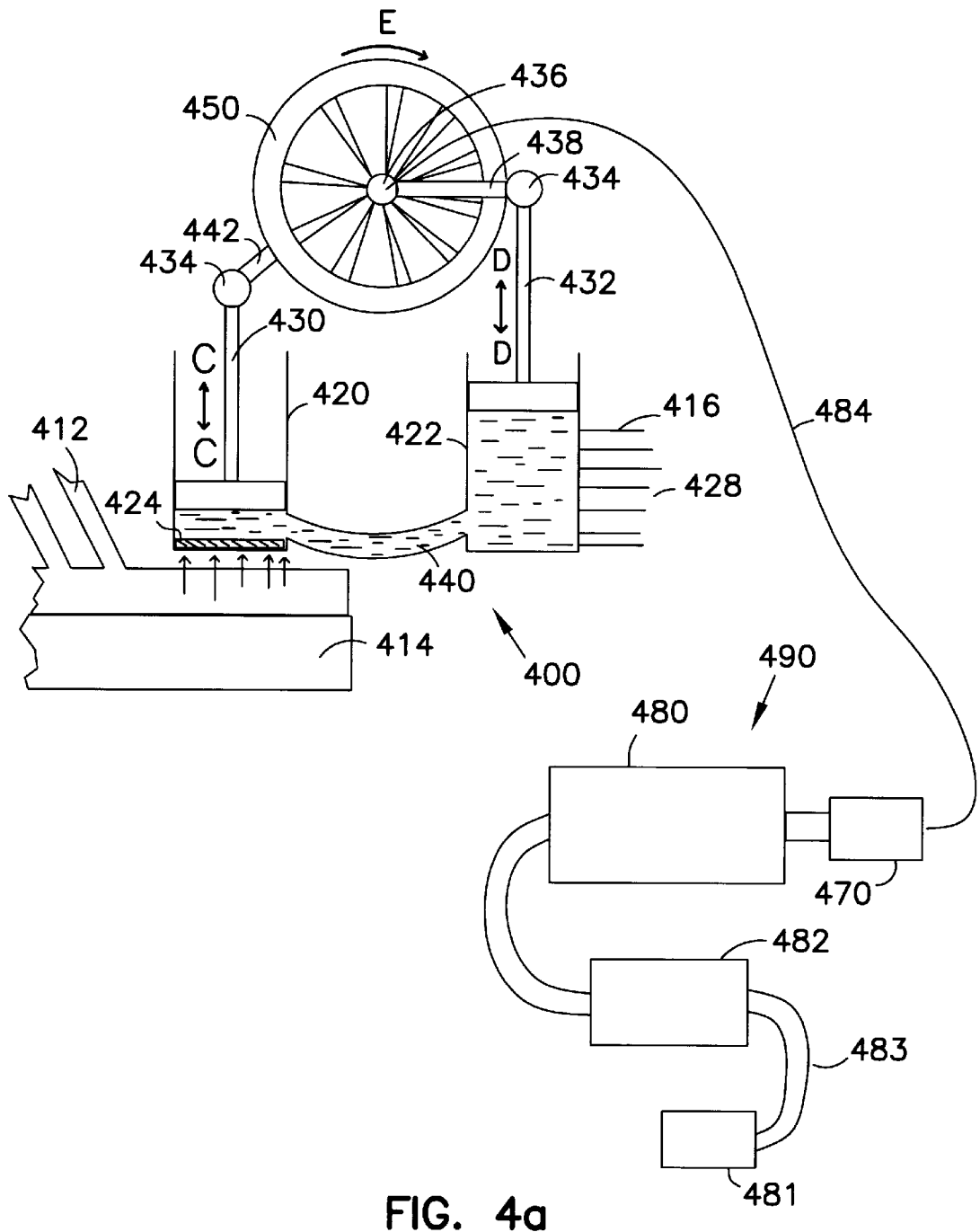
FIG. 4a is a block diagram illustrating a cooling apparatus constructed in accordance with one embodiment of the present invention.
Figure 4B:
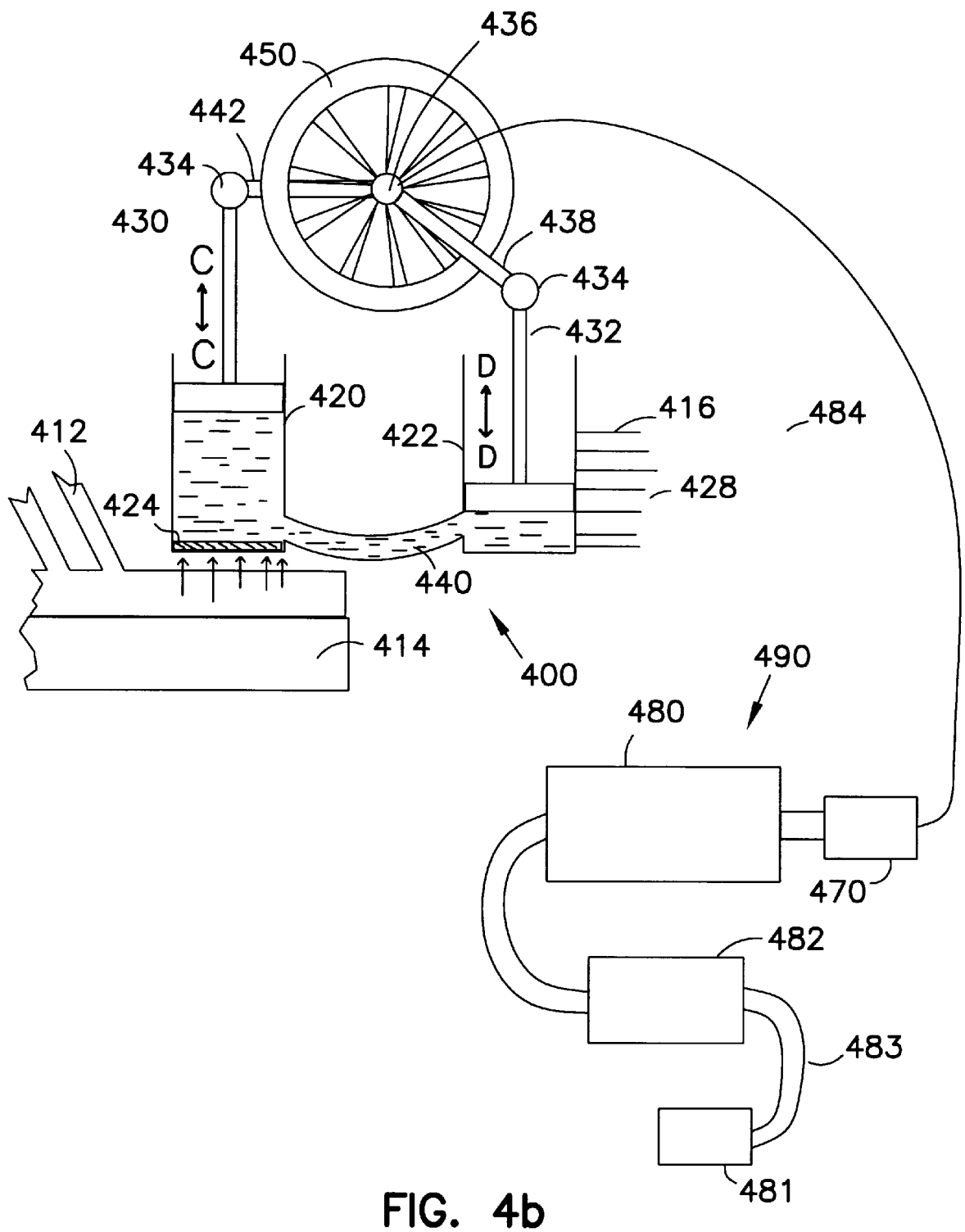
FIG. 4b is a block diagram illustrating a cooling apparatus constructed in accordance with another embodiment of the present invention.

FIGS. 4a and 4b illustrate another embodiment of a cooling apparatus 400. The cooling apparatus 400 generally comprises a hot chamber 420, a cold chamber 422, a flywheel 450, and an electromechanical conversion apparatus 490. In one embodiment, the flywheel 450 has at least one fan coupled therewith. The hot chamber 420 has a hot piston 430 disposed therein, where the hot piston 430 is coupled with a first connecting rod 442 at coupling 434. In one embodiment, the hot chamber 420 is insulated. The first connecting rod 442 is coupled with the flywheel 450 at coupling 436. Similarly, cold chamber 422 has a cold piston 432 received therein. The cold piston 432 is coupled with a second connecting rod 438 at a coupling 434. The second connecting rod 438 is coupled with the flywheel 450 at coupling 436. The couplings 434, 436 operate as bearings between the various components between which they are coupled. The couplings 434, 436 can also be lubricated to facilitate movement between the various components. The flywheel 450 is coupled with the conversion apparatus 490 with a transmission member 484 (represented by a line). The transmission member 484 conveys the rotational movement of the flywheel 450 to the conversion apparatus 490, as will be further described below.

Each chamber 420 and 422 contains a variable amount of working gas within. The gas contained therein can be air or other gases, and are considered within the scope of the invention. The volume of working gas contained within the individual chambers 420, 422 depends on the displacement of the pistons 430, 432. The working gas in the apparatus 400 is sealed from the environment, such that the gas does not go in and out of the chambers 420, 422 to the atmosphere. The pistons 430 and 432 are each coupled with the flywheel 450 such that as the volume in one chamber is reduced, the volume in the other chamber is increased, as will be further discussed below.

The conversion apparatus 490 is coupled with the flywheel 450 such that kinetic energy can be converted to electrical energy. The conversion apparatus 490 comprises a ratio gearbox 470 and a generator 480. In one embodiment, the conversion apparatus 490 also comprises a rectifying circuit 482. The rectifying circuit 482 has an output 483 adapted to be coupled with a battery 481. The ratio gearbox is coupled with a transmission member 484, such as an axle, and the generator 480. The generator 480 is coupled with the rectifying circuit 482, which is adapted to provide a direct current output to provide a trickle charge for charging the battery 481 of the computer. The above components are well known in the art, and therefore will not be further described herein.

The cooling apparatus 400 is provided adjacent to a heat producing component in an electronic device, such as a processor 410 in a computer, such that heat from the processor 410 is transferred to the cooling apparatus 400. Although a processor 410 is described, other heat producing components can also be used. Thermally coupled with the processor 410 is a processor heat sink 412. The processor heat sink 412 assists in cooling the processor 410 as the heat sink 412 draws heat away from the processor 410 and into the environment. The heat sink 412 also supplies heat to the hot chamber 420 for operation of the cooling apparatus 400.

A conduit 440 is disposed between the hot chamber 420 and the cold chamber 422. The conduit 440 is coupled with both the hot chamber 420 and the cold chamber 422 and provides a passage for the working gas within one chamber to travel to the other chamber as the pistons 430, 432 are reciprocating, as will be further discussed below.

A cold chamber heat sink 416 is thermally coupled with the cold chamber 422. In one embodiment, the cold chamber heat sink 416 has a plurality of fins 428 for increasing the surface area of the heat sink 416. The purpose of the cold chamber heat sink 416 is to draw heat away from and out of working gas within the cold chamber 422. Alternatively, a cooling device other than a heat sink can be used to cool working gas within the cold chamber 422.

During operation of the cooling apparatus 400, the hot piston 430 travels in an up and down motion marked as C—C in FIGS. 4*a* and 4*b*. The terms up, down, upward, and downward, are arbitrary and are used only to describe the operation of the relative components and are not intended to limit the orientation of the cooling apparatus 400 in any manner. Many orientations and configurations of the cooling apparatus and the individual components are possible, and are within the scope of the invention.

As the hot piston 430 travels in up and down motion, the first connecting rod 442 is rotated by the hot piston 430 and provides torque to the flywheel 450. As the flywheel 450 is rotated in the direction marked E on FIG. 4*a*, the flywheel 450 acquires momentum from the hot piston 430, as will be discussed further below. Similarly, the cold piston 432 travels in an up and down motion marked as D—D. The up and down motion of the cold piston 432 rotates the second connecting rod 438. The second connecting rod 438 also provides torque to the flywheel 450.

As the processor 410 generates heat, the processor heat sink 412 draws heat away from the processor 410 and disperses the heat into the environment, and also conveys the heat to the heat slug 424. The heat slug 424 draws heat away from the processor heat sink 412 and into the hot chamber 420 of the cooling apparatus 400. As the heat is drawn into the hot chamber 420, the working gas inside the hot chamber 420 is heated and expands. The expansion of the working gas forces the hot piston 430 upward, as shown in FIG. 4*b*. As the hot piston 430 travels upward, rotating the connecting rod 442 which rotates the flywheel 450. After the heated working gas has expanded in the hot chamber 420 and the hot piston 430 is at the end of its expansion stroke, the momentum of the flywheel 150 reverses the direction of the hot and cold pistons 430, 432. The momentum of the flywheel 450 rotates the first connecting rod 442 which then forces the hot piston 430 down, reducing the volume within the hot chamber 420. As the volume is reduced, the working gas is forced through the conduit 440 and into the cold chamber 422. As the working gas is forced into the cold chamber 422, the cold piston 432 is forced upward to expand the volume within the cold chamber 422.

The cold chamber heat sink 416 then draws the heat away from the working gas within the cold chamber 422, and the working gas within the cold chamber 422 is cooled. As the working gas is cooled, the volume of the working gas reduces and the cold piston 432 is retracted down towards the bottom of the cold chamber 422. In addition, the momentum of the flywheel 450 continues to reciprocate the pistons 430, 432 and thereby forces the working gas back through the conduit 440 to the hot chamber 420. Simultaneously, as the cooled working gas is moved from the cold chamber 422, heat is conveyed into the hot chamber 420 from the heat sink 412 to heat the working gas therein. Again, the heated working gas expands within the hot chamber 420 forcing the hot piston 430 in an upward direction, and adding momentum to the flywheel 450. The cycle begins again and continues over and over until heat is no longer provided to the working gas. The cooling apparatus 400 has simultaneously cooled the processor 410 and converted the waste heat to kinetic energy. The momentum of the rotating flywheel 450 can be used to power other devices within the system, such as the conversion apparatus 490.

As stated above, the conversion apparatus 490 is coupled with the rotating flywheel 450 with member 484. The member 484 translates the rotational movement and kinetic energy of the flywheel 450 to the ratio gearbox 470. The ratio gearbox 470 translates the modified rotating movement to the generator 480. The generator 480 converts the rotational movement to electrical energy. The rectifying circuit 282 converts the electrical energy into the appropriate form for use with other components. In one embodiment, the rectifying circuit 282 converts the alternating current to a direct current and is coupled with a battery system of a computer. This provides a significant benefit for computers, and in particular, portable computers, since waste heat generated from the processor is used to charge the battery. In addition, the processor is cooled thereby potentially prolonging the life of the processor and preventing the component from becoming overheated.

Figure 5:
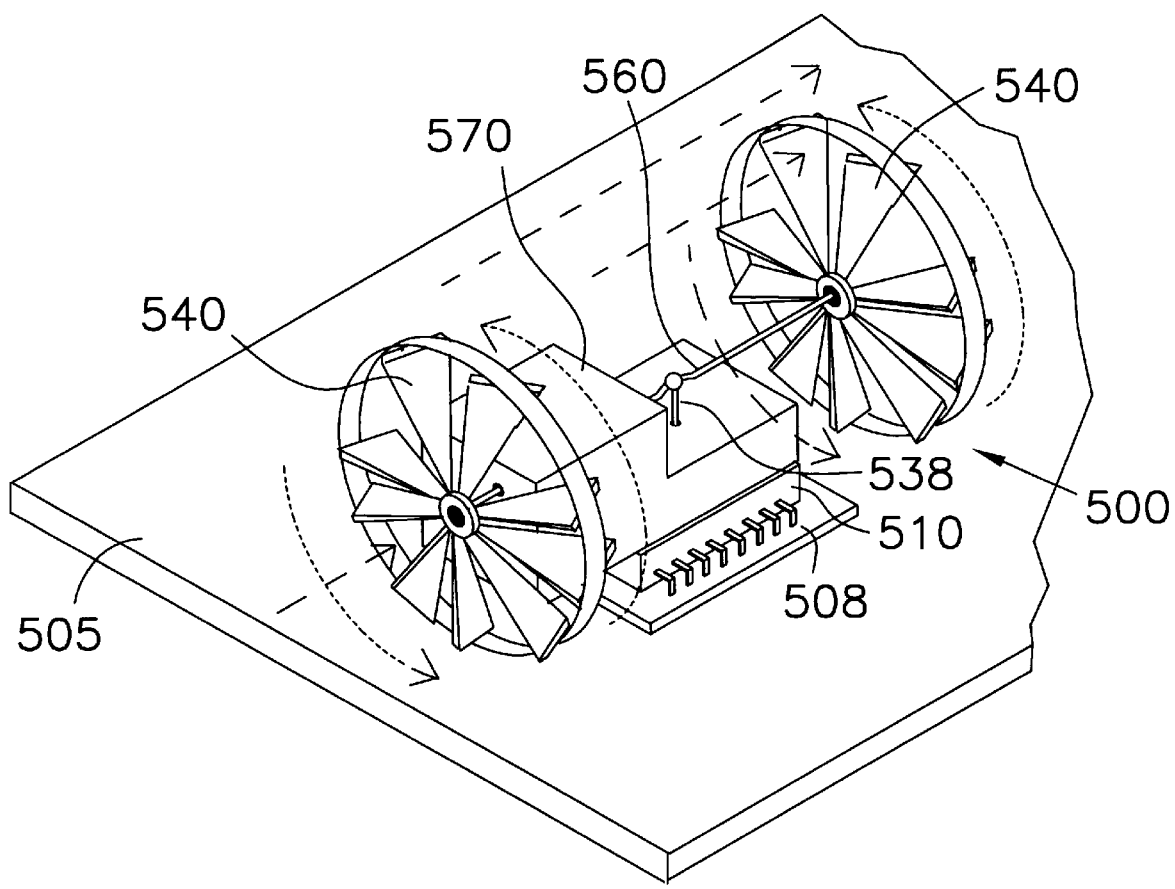
FIG. 5 is a perspective view illustrating an electronic device with a cooling apparatus constructed in accordance with one embodiment of the present invention.

FIG. 5 shows yet another embodiment of the present invention. A cooling apparatus 500 is thermally coupled with a processor 510 disposed within an electronic device 505, such as a computer. The processor 510 is coupled with a printed circuit board 508. Encompassing most of the cooling apparatus 500, in one embodiment, is a housing 570 where the housing 570 protects the components contained therein, as well as providing a visually appealing appearance. The cooling apparatus 500 comprises at least one of the above described embodiments shown in FIGS. 1*a*–4*b*, or any combination of the embodiments. In one embodiment, the cooling apparatus 500 has a connecting rod 538 which is coupled with a piston and chamber (not shown). The connecting rod 538 is coupled with the crankshaft 560, as discussed above. Fans 540 are coupled with the crankshaft 560 such that as the crankshaft 560 is rotated, the fans 540 rotate.

During operation, the processor 510 provides heat to the cooling apparatus 500, which results in reciprocating movement of the connecting rod 538, as discussed above. The reciprocating connecting rod 538 rotates the crankshaft 560 and the fans 540. The rotating fans 540 provide airflow over the cooling apparatus 500 and throughout the system. The cooling apparatus 500 beneficially cools the processor 510 and uses the waste heat generated from the processor 510, which would otherwise be dispersed into the environment, to cool the system.

Heat is drawn away from the processor, thereby cooling the processor. The heat from the processor or other heat producing component drives the apparatus and eventually drives a fan blade, which further cools the processor and the entire computer system. Advantageously, the apparatus cools the processor and the entire computer system without requiring fuel or additional energy since it is powered by the heat generated by the processor. The apparatus converts waste heat into mechanical energy which can be used to cool the system. In addition, the apparatus converts the mechanical energy into useful electricity. The use of this waste heat to generate a trickle charge for the system battery allows for a longer battery life for portable computers.

It is to be understood that the above description is intended to be illustrative, and not restrictive. Many other embodiments will be apparent to those of skill in the art upon reviewing the above description. For instance, the number of chambers, pistons, or fans provided for the cooling apparatus can be modified. In addition, the cooling apparatus can be used to power varying devices within the electronic device or the computer. The scope of the invention should, therefore, be determined with reference to the appended claims, along with the full scope of equivalents to which such claims are entitled.

What is claimed is:

1. A system for cooling electrical components, the system comprising:
   an electronic device having at least one heat producing component, where the heat producing component generates waste heat;
   a cooling apparatus coupled with the electronic device where the cooling apparatus assists in cooling the heat producing component and the electronic device, the cooling apparatus comprising:
   a flywheel; and
   a means for converting the waste heat from the heat producing component into rotational movement of the flywheel.

2. The system as recited in claim 1, the cooling apparatus further comprising a fan coupled with the flywheel.

3. The system as recited in claim 1, wherein the flywheel comprises a crankshaft.

4. The system as recited in claim 1, wherein the electronic device comprises a computer, and the heat producing component comprises a processor.

5. A system for cooling electrical components, the system comprising:
   an electronic device having at least one heat producing component where the heat producing component generates waste heat;
   a cooling apparatus coupled with the electronic device wherein the cooling apparatus assists in cooling the heat producing component and the electronic device, the cooling apparatus comprising:
   a flywheel;
   a hot chamber having a first piston movably disposed therein, the hot chamber thermally coupled with the heat producing component such that waste heat from the heat producing component is conveyed to the hot chamber;
   the first piston being operatively coupled with the flywheel;
   a cold chamber having a second piston movably disposed therein, the second piston being operatively coupled with the flywheel;
   a conduit coupled between the hot chamber and the cold chamber, where the conduit forms a passageway therebetween; and
   a first heat sink thermally coupled with at least a portion of the cold chamber, where the first heat sink cools gas within the cold chamber.

6. The electronic device as recited in claim 5, wherein the cooling apparatus further comprises a second heat sink thermally coupled with the heat producing component and the hot chamber.

7. The electronic device as recited in claim 5, the cooling apparatus further comprising at least one fan operatively coupled with the flywheel.

8. The system as recited in claim 1, the system further comprising a conversion apparatus comprising a generator coupled with the flywheel for converting mechanical energy to electrical energy.

9. The system as recited in claim 8, the conversion apparatus further comprising a transmission member operatively coupled with the flywheel and a gearbox coupled with the transmission member and the generator.

10. The system as recited in claim 1, wherein the means for converting comprises:
    a chamber having a first portion and a second portion, the chamber having a displacer movably disposed therein, the chamber being thermally coupled with the heat producing component proximate the first portion such that waste heat from the heat producing component is conveyed to the first portion of the chamber;

a rotatable crankshaft having a first throw;

the displacer movable between the first portion and the second portion of the chamber, the displacer coupled with the first throw of the crankshaft;

a power piston disposed in the second portion of the chamber and movable between a first position and a second position, where the power piston is operatively coupled with the a second throw of the crankshaft such that movement of the piston between the first position and the second position rotates the crankshaft; and a heat sink thermally coupled with the chamber proximate to the second portion of the chamber.

11. The system as recited in claim 10, wherein the displacer is coupled with the crankshaft with at least one connecting rod.

12. The system as recited in claim 10, where the phase of the first and second throws are spaced about ninety degrees apart.

13. The system as recited in claim 10, the cooling apparatus further comprising at least one fan coupled with the crankshaft such that rotation of the crankshaft causes rotation of the fan.

14. The system as recited in claim 13, wherein at least one fan is weighted.

15. The system as recited in claim 10, wherein the heat producing component comprises a central processor unit.

16. The system as recited in claim 1, wherein the means for converting comprises:

a rotatable crankshaft having a first throw and a second throw;

a hot chamber having a first piston movably disposed therein, the hot chamber thermally coupled with the heat producing component such that waste heat from the heat producing component is conveyed to the hot chamber;

the first piston being operatively coupled with the first throw of the crankshaft;

a cold chamber having a second piston movably disposed therein, the second piston being operatively coupled with the second throw of the crankshaft;

a conduit coupled between the hot chamber and the cold chamber, where the conduit forms a passageway therebetween; and a first heat sink thermally coupled with at least a portion of the cold chamber, where the first heat sink cools gas within the cold chamber.

17. The system as recited in claim 16, wherein the flywheel comprises at least one fan coupled with the crankshaft such that rotation of the crankshaft causes rotation of the fan.

18. The system as recited in claim 16, further comprising three fans, where a first and second fan are disposed at each end of the crankshaft, and a third fan is coupled to the crankshaft between the hot chamber and the cold chamber.

19. The system as recited in claim 16, where a phase of the first and second throw are spaced ninety degrees apart.

20. The system as recited in claim 16, where the cold piston further comprises a first connecting rod coupled with the second throw of the crankshaft, and the hot piston further comprises a second connecting rod coupled with the first throw of the crankshaft.

* * * * *